ELECTRONIC THRESHOLD SWITCH

Filed Nov. 10, 1964 2 Sheets-Sheet 1

INVENTOR.
CARL D. TODD,
BY J. K. Haskell
ATTORNEY.

INVENTOR.
CARL D. TODD,
BY J. K. Haskell
ATTORNEY.

United States Patent Office 3,307,048

Patented Feb. 28, 1967

3,307,048
ELECTRONIC THRESHOLD SWITCH

Carl D. Todd, Costa Mesa, Calif., assignor to Hughes Aircraft Company, Culver City, Calif., a corporation of Delaware Filed Nov. 10, 1964, Ser. No. 410,063
5 Claims. (Cl. 307—88.5)

This invention relates to electronic threshold switches and more particularly to those utilizing semiconductor devices.

There are instances, such as transducer applications, in which it would be desirable to remove low level noise in a pulse train. A usual method of doing this has been to use a threshold clipper and remove the lower portions of the signal. However, this method destroys the true zero reference and creates errors in the amplitude of the desired signal.

A principal object of this invention, therefore, is to provide an improved electronic switch.

A further object of this invention is to provide an electronic switch which will produce an output voltage when and only when an input signal voltage of predetermined polarity exceeds a predetermined threshold value, the output voltage waveform then substantially duplicating the input voltage waveform.

A still further object of this invention is to provide an improved electronic threshold switch utilizing semiconductor devices for accurately sensing the output of a transducer or the like.

The electronic threshold switch provided in accordance with the present invention has input and output terminals and comprises first means coupled to the input terminals for providing a control current in response to those portions of an input signal voltage of predetermined polarity exceeding a predetermined threshold amplitude; and second means coupled to the first means for effectively coupling the input terminals to the output terminals in response to the control current.

The invention will be more fully described hereinafter by way of example and with reference to the accompanying drawings wherein.

Figure 2:
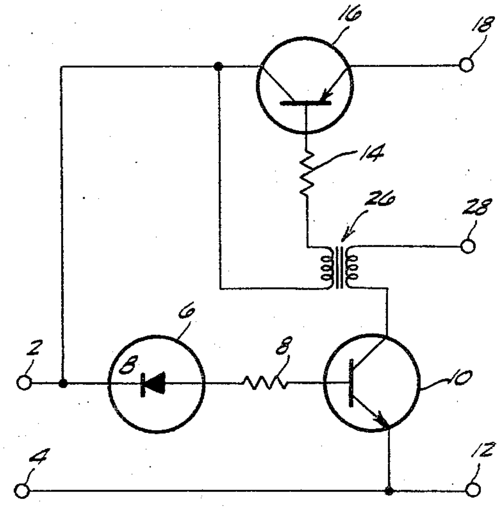
FIG. 2 is a schematic diagram showing another electronic threshold switch according to the invention in which provision is made for accepting driving power from a source other than the source providing the input signal.
Figure 5:
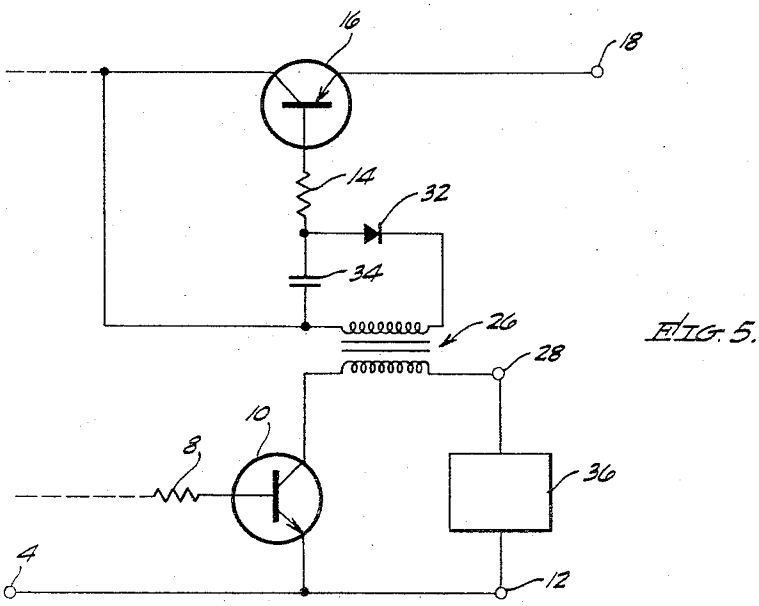
Figure 6:
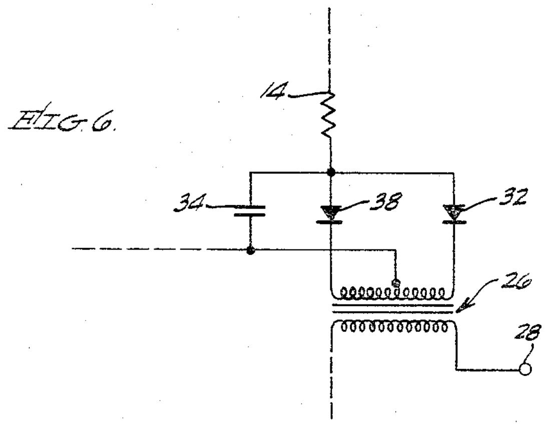

FIG. 5 is a schematic diagram showing a modification of a portion of the switch of FIG. 2 in which a square wave generator (shown in block form) is provided to furnish the driving power, and a half-wave rectifier and filter arrangement is provided to let the output signal voltage follow the input signal voltage for a predetermined period of time after the expiration of each drive pulse; and FIG. 6 is a schematic diagram showing a modification of a portion of the switch of FIG. 5 in which a full-wave rectifier is provided instead of a half-wave rectifier to permit the switch to stop conducting rapidly at the end of each drive pulse.

Figure 1:
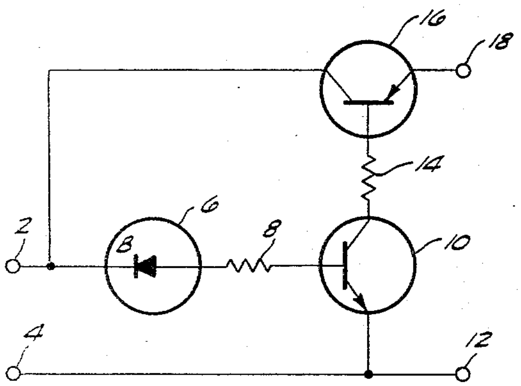
FIG. 1 is a schematic diagram showing an electronic threshold switch according to the invention in which provision is made for accepting an input signal furnishing driving power for the switch.

In the embodiment of FIG. 1 first and second input terminals 2, 4 are provided, as well as a breakdown diode 6, such as a zener diode, the cathode of which is coupled to the first input terminal 2. A first impedance element 8, such as a resistor and a first transistor 10 are also provided, the first impedance element 8 being coupled between the anode of the breakdown diode 6 and the base electrode of the first transistor 10 for limiting base current to tolerable levels. The emitter electrode of the first transistor 10, which is an n-p-n transistor in this example, is coupled to the second input terminal 4 and a first output terminal 12. A second impedance element 14, such as a resistor, and a second transistor 16 are also provided, the second impedance element 14 being coupled between the collector electrode of the first transistor 10 and the base electrode of the second transistor 16 for limiting base current in the latter. The emitter electrode of the second transistor 16, which is a p-n-p transistor in this example, is coupled to the second output terminal 18, and the collector electrode of the second transistor 16 is coupled to the first input terminal 2.

Application to the input terminals 2, 4 of an input signal voltage of positive polarity and greater amplitude than the breakdown potential of the breakdown diode 6 will cause base current to flow in the first impedance element 8 and will turn on the first transistor 10. This in turn will cause base current to flow in the second impedance element 14 and turn on the second transistor 16 which is used as an inverted switch, thus placing the second output terminal 18 at substantially the same potential as the first input terminal 2.

Application to the input terminals 2, 4 of a negative input signal voltage or of any input signal voltage less than the breakdown potential of the breakdown diode 6 will not start the above-described chain of events, hence, will result in an output voltage of substantially zero value.

Figure 3:
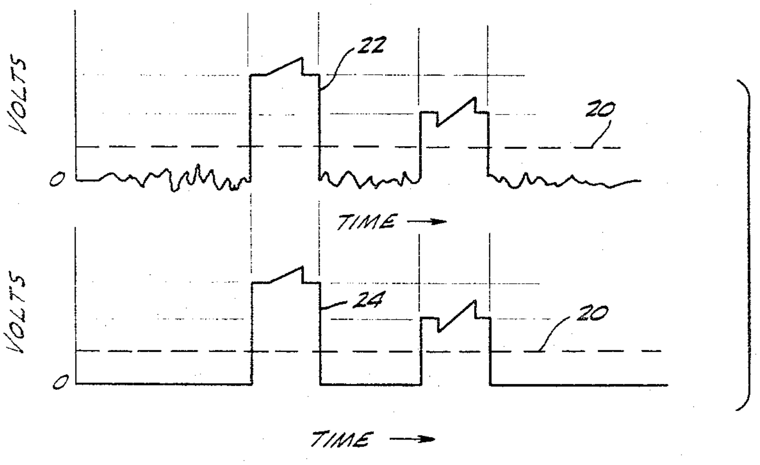
FIG. 3 is a diagram of waveforms representing an input signal voltage and the resulting output voltage associated with the electronic threshold switch of FIG. 1.
Figure 4:
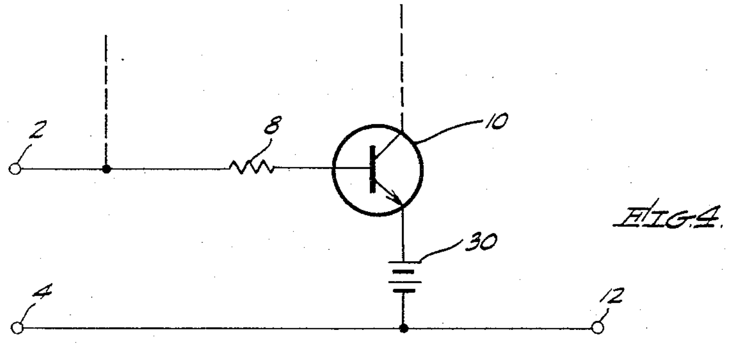
FIG. 4 is a schematic diagram showing a modification of a portion common to the switches of FIGS. 1 and 2 in which a voltage supply instead of a voltage breakdown device is provided to set the threshold value for switch operation.

Referring to FIG. 3, operation of the threshold switch of FIG. 1 is described graphically. The dotted line 20 represents the threshold potential which is essentially the breakdown potential of the breakdown diode 6. An input signal voltage is represented by waveform 22 and the corresponding output voltage by waveform 24. It will be noted that waveform 24 is substantially identical in shape and amplitude with waveform 22 whenever waveform 22 is above the threshold level and that it is substantially zero whenever waveform 22 is less than the threshold level.

If it is desired to make the threshold switch responsive to signals of a negative rather than a positive polarity, the breakdown diode 6 may be reversed. In this case it is necessary to use a p-n-p transistor in place of the first transistor 10, and an n–p–n transistor in place of the second transistor 16.

In the circuit of FIG. 1 the input signal supplies the driving power. However, where the input signal is insufficient to drive the switch the circuit of FIG. 2 may be utilized. This is basically the same as the circuit of FIG. 1 except that means are provided for accepting an additional driving signal, namely, a transformer 26 whose primary is coupled between a third input terminal 28 and the collector electrode of the first transistor 10 and whose secondary is coupled between the second impedance element 14 and the collector electrode of the second transistor 16. The driving signal voltage is applied between the third input terminal 28 and the second input terminal 4, and current is gated through the first transistor 10 provided there is an input signal voltage above the threshold value applied across the first and second input terminals 2, 4.

The threshold may, of course, be controlled, as in FIG.

4, by shorting out the breakdown diode 6 in the circuits of FIGS. 1 and 2 and connecting a low impedance voltage source 30, such as a battery, between the emitter electrode of the first transistor 10 and the second input terminal 4. Note that this circuit is not limited to small voltages and hence may be used for any levels. Moreover, the low impedance voltage source 30 may be varied according to a prescribed function to vary the threshold correspondingly.

Other modifications may also be made within the scope of the invention, as in FIGS. 5 and 6, for example. Referring to FIG. 5, a diode rectifier 32 is conductively poled in series with the secondary winding of the transformer 26, while a capacitor 34 shunts the rectifier 32 and the secondary winding, one terminal of the impedance element 14 being connected to the junction between the rectifier 32 and the capacitor 34. A square wave generator 36 is connected between the third input terminal 28 and the first output terminal 12 to furnish a constant D.C. base drive to turn on the second transistor 16 when the input signal voltage is above the threshold. Depending on the time constant of the second impedance element 14 and the capacitor 34, the transistor 16 may then conduct even after the input signal voltage drops below the threshold value. This arrangement can be used to advantage where it is desired to mute the output signal voltage until the input signal voltage exceeds the threshold level and then have the output signal voltage follow the input signal voltage even though it may drop below the threshold level.

A full-wave arrangement of the rectifier circuit is shown in FIG. 6, the collector electrode of the transistor 16 being connected to a center tap of the secondary winding of the transformer 26, and a diode 38 being connected between the impedance element 14 and that terminal of the secondary winding to which the diode 32 is not connected. This arrangement has the advantage of quicker response, particularly at the end of the drive pulse, since the capacitor 34 may be made very small or even omitted in some cases.

For critical applications it is possible to match the temperature coefficients of the breakdown diode 6 with that of the base-to-emitter voltage drop in the first transistor 10, so as to yield a threshold voltage which is fairly constant over a range of temperatures.

There has thus been described an improved electronic switch useful for transducer applications among others.

What is claimed is:

1. An electronic threshold switch for coupling a first circuit to a second circuit in response to a predetermined voltage in said first circuit, comprising:

- a first pair of terminals for receiving said first circuit and a second pair of terminals for receiving said second circuit;
- a control transistor having a base electrode, an emitter electrode and a collector electrode;
- circuit means including a threshold voltage device, coupling said base and emitter electrode in a control circuit commonly coupled at one end to one terminal of said first pair of terminals and to one terminal of said second pair of terminals and coupled at the other end to the remaining terminal of said first pair of terminals, for providing a control current in the base-emitter portion of said control transistor after the voltage applied to said device exceeds the threshold voltage of said device;
- a coupling transistor of a conductivity type opposite to that of said control transistor, having a base electrode and having two additional electrodes, the latter being coupled respectively to said remaining terminal of said first pair of terminals and to the remaining terminal of said second pair of terminals; and
- circuit means coupling said base electrode of said coupling transistor to said collector electrode of said control transistor for causing said coupling transistor to conduct when said control transistor becomes conductive in the presence of said control current.

2. Apparatus as set forth in claim 1 in which said threshold voltage device comprises a voltage breakdown diode.

3. Apparatus as set forth in claim 1 in which said threshold voltage device comprises a direct current source poled in opposition to control current flow in said control circuit.

4. Apparatus as set forth in claim 1 wherein said last named circuit means includes a transformer having a primary winding circuit coupled to said collector electrode of said control transistor and having a connection for receiving a supply of electrical energy, and having a secondary winding circuit coupled to said base electrode of said coupling transistor.

5. Apparatus as set forth in claim 4 wherein said supply of electrical energy is a square wave voltage source and comprising additionally:

- rectifier means conductively poled in series in said secondary winding circuit; and
- a capacitor shunting said rectifier means and the secondary winding in said secondary winding circuit.

References Cited by the Examiner

UNITED STATES PATENTS

| | | | |
|---|---|---|---|
| 2,986,677 | 5/1961 | Hechler | 307—88.5 |
| 3,121,175 | 2/1964 | Vigneron | 307—88.5 |
| 3,122,651 | 2/1964 | Hawkins et al. | 307—88.5 |
| 3,135,897 | 6/1964 | Lee | 307—88.5 |
| 3,150,228 | 9/1964 | Grobbs et al. | 84—1.26 |
| 3,171,976 | 3/1965 | Hoffman | 307—88.5 |
| 3,194,979 | 7/1965 | Toy | 307—88.5 |
| 3,196,201 | 7/1965 | McDonald | 84—1.26 |
| 3,229,225 | 1/1966 | Schimpf | 307—88.5 |

FOREIGN PATENTS

| | | |
|---|---|---|
| 635,258 | 1/1962 | Canada. |

ARTHUR GAUSS, *Primary Examiner.*

I. C. EDELL, *Assistant Examiner.*